(12) United States Patent
Huang (10) Patent No.: US 9,857,403 B2
(45) Date of Patent: Jan. 2, 2018

(54) MOBIL TROLLEY FOR RESISTANCE MEASUREMENT

(71) Applicant: Chien-Ten Huang, New Taipei (TW)

(72) Inventor: Chien-Ten Huang, New Taipei (TW)

(*) Notice: Subject to any disclaimer, the term of this patent is extended or adjusted under 35 U.S.C. 154(b) by 64 days.

(21) Appl. No.: 15/046,449

(22) Filed: Feb. 18, 2016

(65) Prior Publication Data

US 2017/0160322 A1 Jun. 8, 2017

(30) Foreign Application Priority Data

Dec. 4, 2015 (TW) ............... 104140807 A
Dec. 18, 2015 (TW) ............... 104142821 A (51) Int. Cl.
*G01R 29/12* (2006.01)
*G01R 27/02* (2006.01)
*G01R 15/16* (2006.01)

(52) U.S. Cl.
CPC ........... *G01R 27/02* (2013.01); *G01R 15/165* (2013.01); *G01R 29/12* (2013.01)

(58) Field of Classification Search
CPC ....... G01R 27/02; G01R 29/12; G01R 15/165
USPC ......................................... 324/457, 458, 525
See application file for complete search history.

(56) References Cited

U.S. PATENT DOCUMENTS

2003/0080748 A1* 5/2003 Newman ................ G01N 27/07
324/458

* cited by examiner

*Primary Examiner* — Amy He
(74) *Attorney, Agent, or Firm* — Pro-TECHTOR International Services; Ian Oglesby (57) ABSTRACT

A mobile trolley for resistance measurement comprises: a frame, a resistance measurer, a lifting system, a substrate, at least a first electrode, plural second electrodes and a control module, wherein the set locations of the first and the second electrodes agree with the test method of the "ESD association" standard, whereby the electric resistance between the first and the second electrodes are measured; thereby it is easy to measure the resistance value of a floor according to the test method of the "ESD association" standard.

9 Claims, 12 Drawing Sheets

MOBIL TROLLEY FOR RESISTANCE MEASUREMENT

FIELD OF THE INVENTION

The present invention relates to a mobile trolley for resistance measurement; particularly to a mobile trolley for resistance measurement, which can measure resistance value of a floor according to the test method of the "ESD association" standard.

BACKGROUND OF THE INVENTION

The main object of the "ESD Association" Standard is to provide a test method, whereby a floor used to control static is evaluated.

Figure 14:
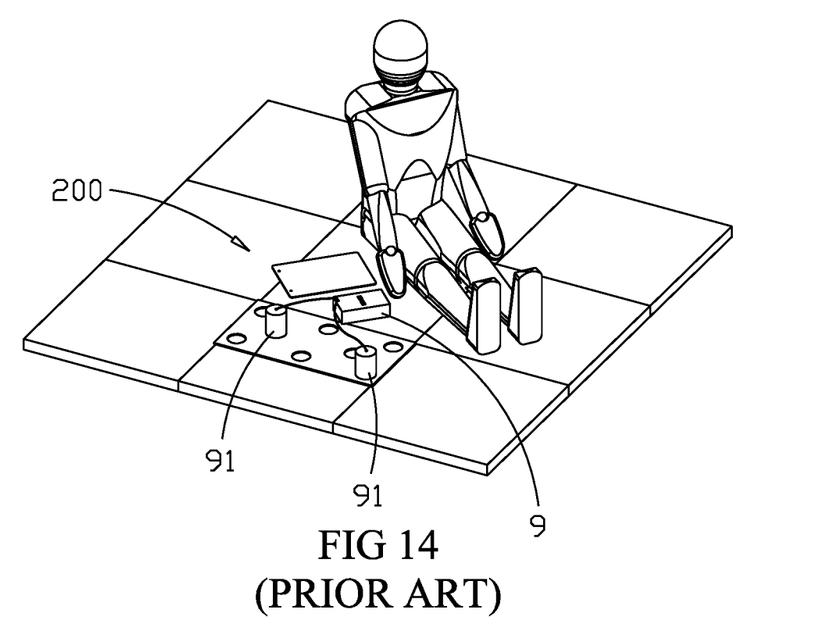
FIG. 14 shows a conventional equipment in using status.

As shown in FIG. 14, a conventional measuring equipment 200 is constructed of a resistance measurer 9 and two electrodes 91 for resistance value measurement. In order to measure resistance value of actual using, it is necessary to test an installed floor. However, conventional equipment has at least following disadvantages.

1. It is very hard to work for user. By measuring an installed floor the user has to sit or kneel to operate. Thus a team work of labors for turning around in operation is necessary.

2. It takes much time for measurement, since the user has to move electrodes to measure resistance value of each point individually.

3. It is very complicated for operation, since user needs first to move for putting electrodes and resistance measurer by himself, than makes measurement and record. Furthermore, it is possible that the equipment falls down by accidence.

In view of these disadvantages the inventor tried the continuous testing and improvement and developed the present invention.

SUMMARY OF THE INVENTION

The main object of the present invention is to provide a mobile trolley for resistance value measurement according to test method of the "ESD association" standard, for resistance value measurement of a floor, wherein electrodes are located conveniently.

For achieving above object the present invention comprises: a frame, with a predestinated height, having an operation panel at the top; a resistance measurer, set on the said operation panel; a lifting system, set in the under section of the frame, connected with a substrate, wherein lifting of the substrate is controlled; at least a first electrode, set on the said substrate corresponding to a predestined ground point of a testing floor, wherein set location thereof agrees with the "ESD association" standard; plural second electrodes, distributed on the substrate, corresponding to predestined ground points of a testing floor, wherein set locations thereof agree with the "ESD association" standard; a control module, set on the said operation panel, electrically connected with the first electrode, the second electrodes and the resistance measurer respectively, whereby the first electrode and one of the second electrodes are together connected with the resistance measurer; thereby the resistance value is measured.

Preferably, the control module is of manual control having at least a first control button and plural second control buttons; wherein the first control button is connected with the first electrode; while the second control buttons are connected with the second electrodes respectively; thereby it is easy for user to switch the different second electrodes individually manually.

Preferably, the control module is of automatic control having at least a control switch; the first electrode is electrically connected with the resistance measurer, as soon as the automatic control a has received "on"-signal, and together electrically connected with each one of the second electrodes individually, whereby the resistance value is measured; thereby it is achieved to save labor work.

Preferably, there are two first electrodes; set locations of these first electrodes agree with the ground points A and B of the ANSI/ESD S7.1-2005 standard, mentioned in the point 6.

Preferably, there are six second electrodes; set locations of these second electrodes agree with the test method of the ANSI/ESD S7.1-2005 standard, mentioned in the point 6.

Preferably, the said control module is constructed of a first control button and six second control buttons.

Preferably, the said first control button, the two first electrodes and the resistance measurer are electrically connected, wherein there are a first option and a second option; the first one of the two first electrodes is electrically connected with the resistance measurer if the first option is optioned; while the second one of the first electrodes is electronically connected with the resistance measurer if the second option is optioned.

Preferably, the said six second control buttons are electrically connected with the six second electrodes, and all of them are electrically connected with the resistance measurer, whereby there are options of "on" and "off"; wherein the second electrodes and the resistance measurer are electrically connected if "on" is optioned, while the second electrodes and the resistance measurer are electrically disconnected if 'off' is optioned.

Preferably, the said control module is of automatic control, having at least a control switch; the control switch begins to work according to resistance value measurement steps, as soon as the control module has received "on"-signal, these measurement steps comprise: (s1): let the first one of the two first electrodes electrically connect with the resistance measurer and together connect with each one of the second electrodes individually, whereby resistance value is measured; (s2): let the second one of the two first electrodes and the resistance measurer electrically connect and together connect with each one of the second electrodes individually, whereby the resistance value is measured.

Preferably, the resistance measurer is connected with a computer; wherein the computer saves the resistance value measured by the resistance measurer.

Preferably, there are plural roles under the frame.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 5~9 show an embodiment of control module of manual control in coordination with manual recording;

FIG. 10-11 show an embodiment of the control module of the present invention of automatic control in coordination with manual recording.

DESCRIPTION OF THE PREFERRED EMBODIMENTS

Figure 1:
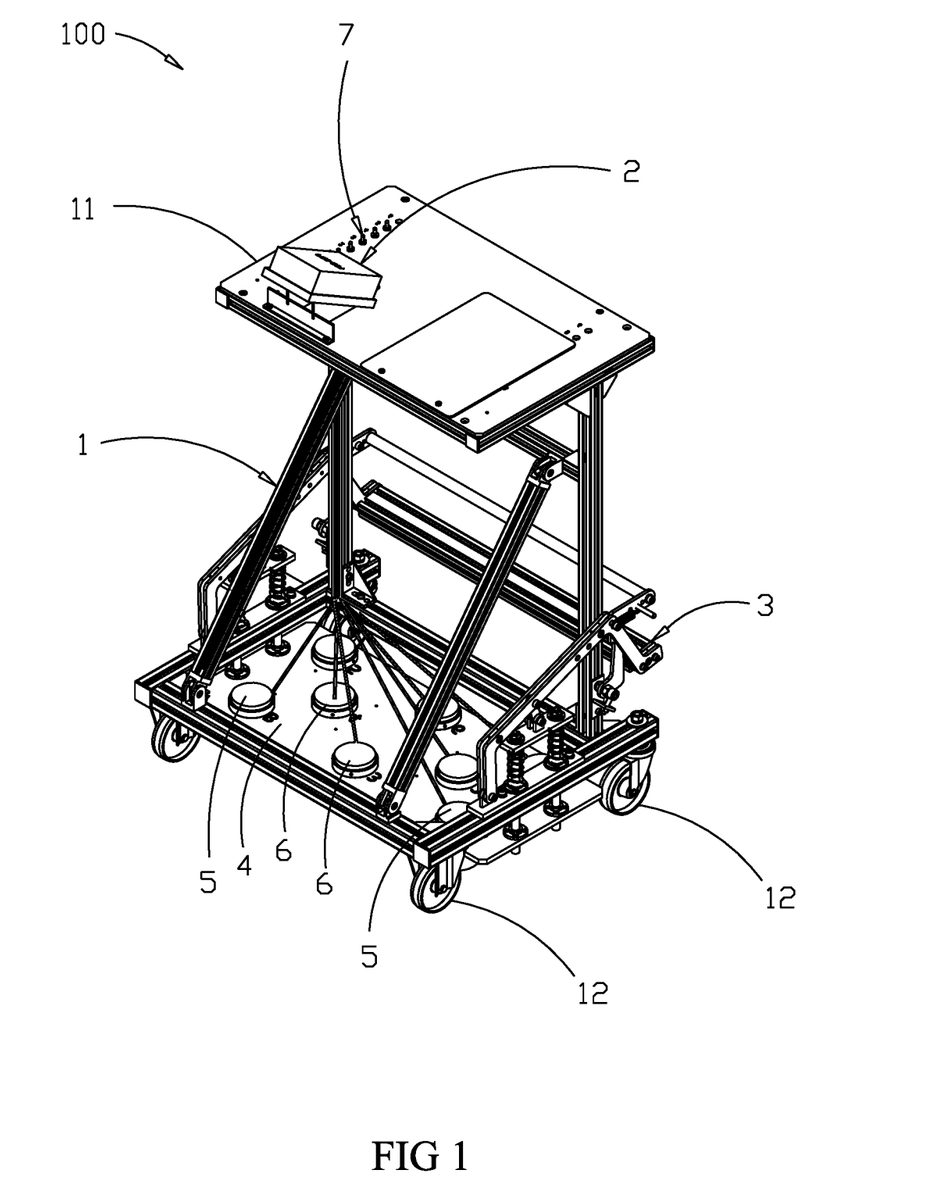
FIG. 1 is a perspective view a the present invention.

As shown in FIG. 1, the mobile trolley for resistance measurement 100 of the present invention comprises: a frame 1, with a predestined height, having an operation panel 11 at the top; a resistance measurer 2, set on the said operation panel; a lifting, system 3, set in the under section of the frame, connected with a substrate 4, wherein lifting of the substrate is controlled; at least a first electrode 5, set on the said substrate, corresponding to a ground point of predestined testing floor, wherein set location of the first electrode agree with the test method of the "ESD association" standard; plural second electrodes 6, distributed on the substrate, corresponding to predestined measuring points of the predestined testing floor, wherein set locations of the second electrodes agree with the test method of the "ESD association" standard; a control module 7, set on the said operation panel, electrically connected with the first electrode, the second electrodes and the resistance measurer respectively, wherein the first electrode and one of the second electrodes are together electrically connected with the resistance measurer, whereby the resistance is measured. Thereby it is easily achieved, to measure resistance value of the testing floor according to test method of the "ESD association" standard.

The frame 1 with a predestined height, preferably in a height of which user can operate the equipment by standing; wherein there is an operation panel 11 at the top for carrying other components.

In case the mobile trolley for resistance measurement 100 of the present invention is applied in the predestined testing floor 101, which is finish installed, at the bottom of the frame 1 there are plural roles 12, thereby it is easy to move and can furthermore measure each floor individually. Of cause a brake system can be set in the frame 1 (not shown), thereby locating is more convenient.

The resistance measurer 2 set on the operation panel is used to measure resistance values of the contact points between two electrodes on the predestined testing floor 101, wherein conventional skill e.g. PRS-801 Resistance System is applied. Conventional skill will not be mentioned here.

Figure 2:
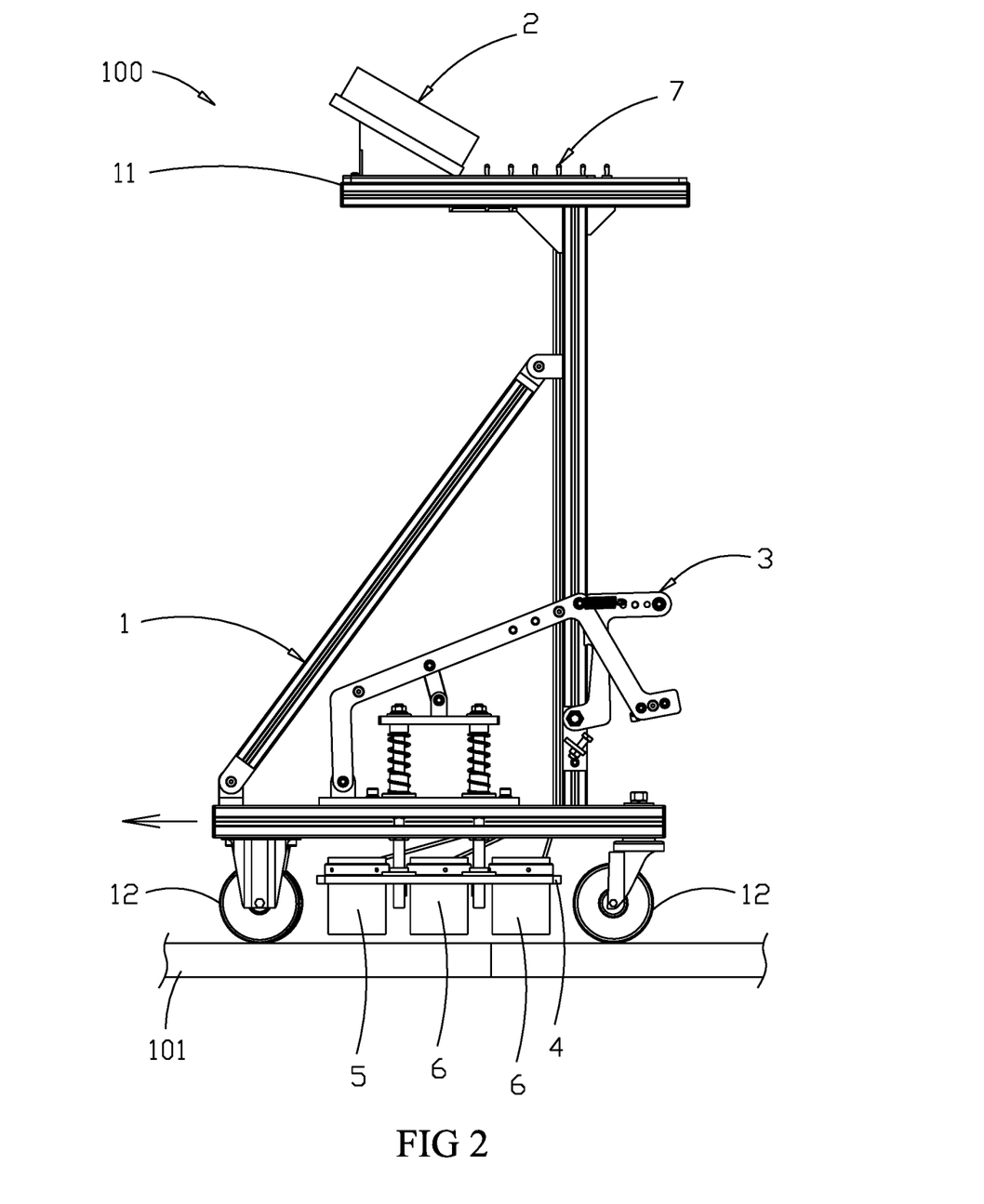
FIG. 2 is a lateral view of the present invention.
Figure 3:
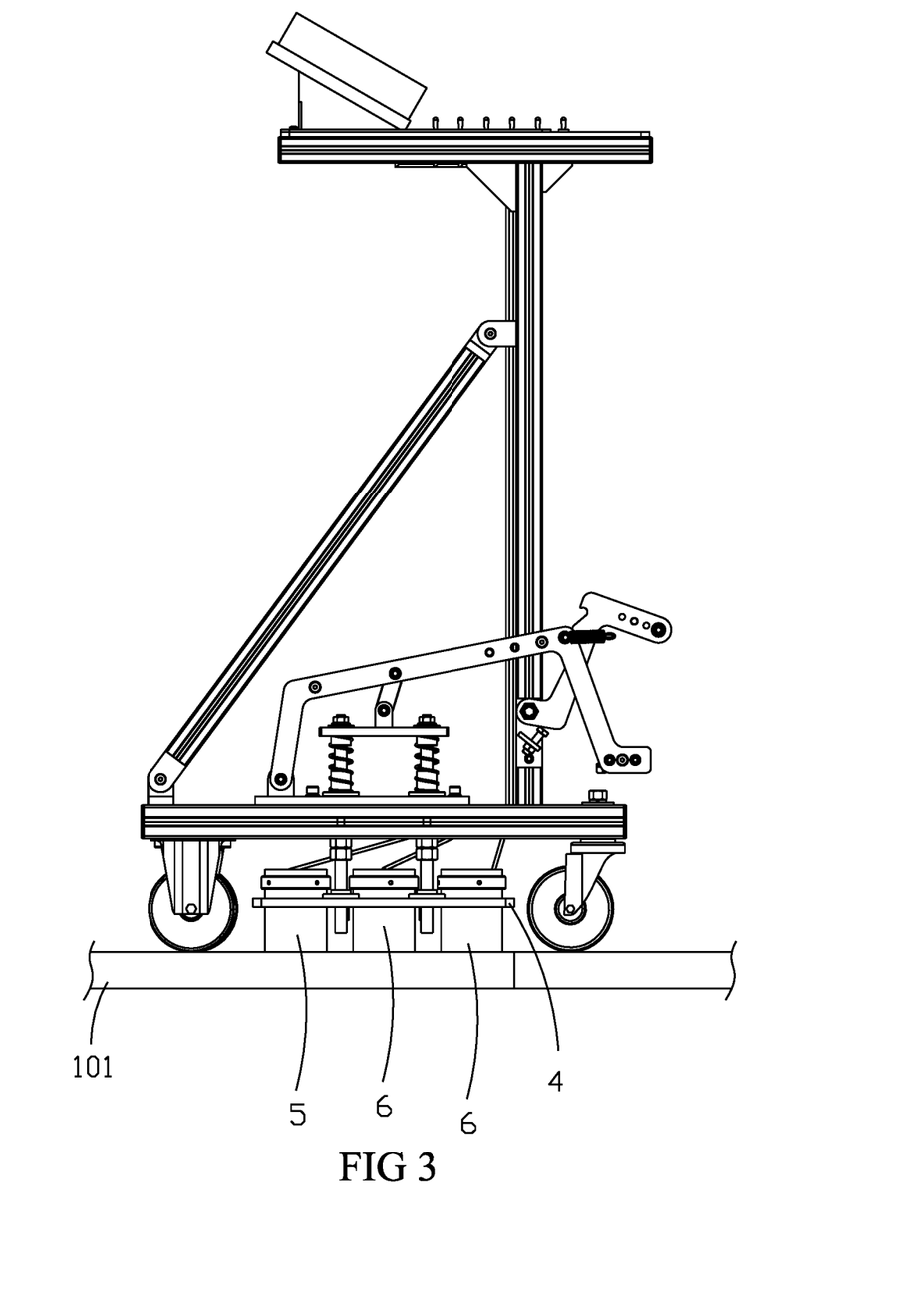
FIG. 3 is a lateral view, while substrate is declined, what makes the first electrode and the second electrodes touching a predestined testing floor.

The lifting system 3 set in under section of the frame 1, is connected with a substrate 4, whereby lifting of the first electrode 3 and the second electrodes 6 on the substrate 4 is controlled. As shown in FIG. 3, the first electrode 3, the second electrodes 6 can touch top surface of the predestined testing floor 101 when the substrate 4 falls down, and furthermore the resistance value is measured. As shown in FIG. 2, it is easy to move the frame, when the substrate 4 ascends. The lifting system 3 has a linkage mechanism, wherein a spring is used to store power to rise the substrate. Therefore, the lifting system 3 is forced to fall down, when the substrate 4, the first electrode 3 and the second electrodes 6 are failing down, whereby the spring can generate power to elevate the substrate.

The first electrode 5 set on the substrate, corresponding to a predestined ground point of a testing floor 101; the second electrodes 6 set distributed on the substrate, corresponding to predestined ground points of a testing floor 101; thereby the resistance values between each predestined measured point and ground points are measured. Thereby the efficacy of static discharge of the predestined testing floor is known.

Figure 4:
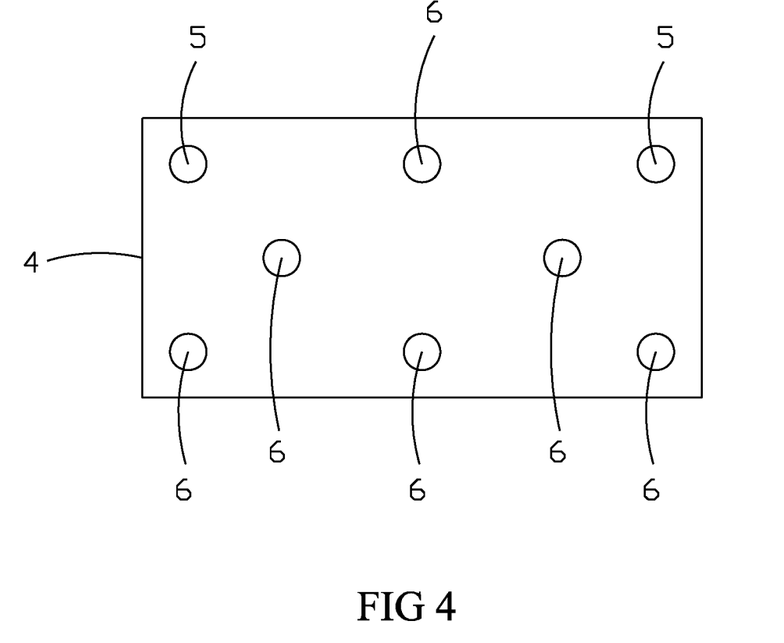
FIG. 4 shows electrodes of the present invention distributed on the substrate.

As shown in FIG. 4, amount and set locations of the first electrode 5 and the second electrodes 6 agree with the test method of the "ESD Association" Standard.

Construction of the first electrode 5 and the second electrodes 6 also agree with the test method of the "ESD association" standard, that is, they are cylinder metal electrodes of 2.27 kg±0.06 kg, with a diameter of 63.5 mm±0.25 mm, wherein each electrode of conductive material with hardness of SHORE-A50-70 is electrically connected with the resistance measurer 2 through the control module 7. When 10V or less than 10V is used to measure resistance value between two electrodes on metal surface, the resistance value is less than 1000Ω.

Appendixes 1-3 show the embodiments of the present invention, wherein wires connected with electrodes are removed for demonstration purpose. Before the first electrode 5, the second electrodes 6 are installed, these electrodes can be cleared up according to the test method of the "ESD association" standard. Each electrode has a T-shape handle for carrying.

The control module 7 set on the substrate, are electrically connected with the first electrode, the second electrodes and the resistance measurer respectively; wherein the first electrode and one of the second electrodes are together electrically connected with the resistance measurer, whereby the resistance values between the first electrode and the second electrodes are measured, wherein there are options of manual or automatic control, to choose locations, corresponding to the first electrode and the second electrodes, to be measured, whereby resistance values between the first electrode and contacting positions of each second electrodes are measured individually.

In case the control module 7 is of manual control, having at least a first control button and plural second buttons, wherein the first control button is connected with the first electrode, while the second buttons are connected with the second electrodes; thereby it is easy to switch different second electrodes individually with manual control.

In case the control module 7 is of automatic control, having at least a control switch; wherein the first electrode is electrically connected with the resistance measurer, as soon as the control module has received "on"-signal, and then they are together electrically connected with each of the second electrodes individually, whereby resistance values are measured; thereby it is achieved to save manual labor.

In resistance value measurement with the said system there are options of manual recording or computer recording to record resistance values. Computer recording can make the resistance measurer 2 connected with a computer, thereby resistance values measured by the resistance measurer 2 are saved. A judgement program is set in computer, whereby it is judged if the measured resistance values agree with the test method of the "ESD association" standard. Besides, an alarm lamp corresponding to the judgement program can also be set in computer, e.g. if test has been passed, it blinks green, if not, it blinks red.

Figure 5:
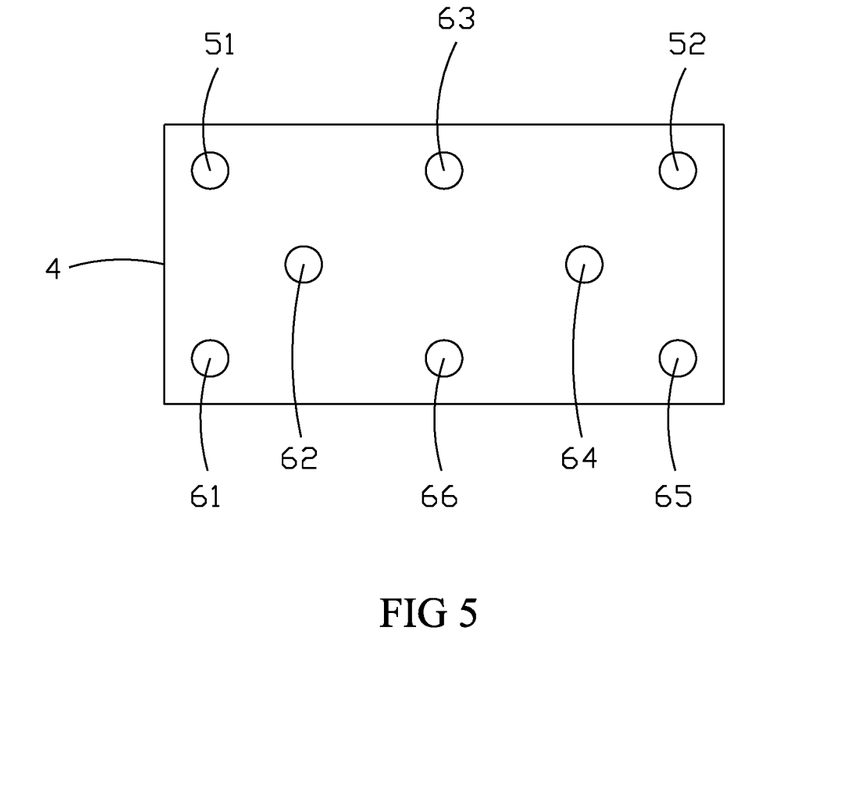
FIG. 5 shows the electrodes of the present invention distributed on the substrate.

FIG. 5-9 show an embodiment of control module 7 of manual control in coordination with manual recording. As shown in FIG. 5, the first electrode and the second electrodes of the present invention are set according to the test method of the ANSI/ESD S7.1-2005 standard, therefore, on the substrate there are two first electrodes 51, 52 wherein locations of the two first electrodes 51, 52 agree with the ground point A and ground point B, mentioned in the point six of the test method of the ANSI/ESD S7.1-2005 standard. Besides, there are six second electrodes 61, 62, 63, 64, 65, 66 set on the substrate; wherein locations of the second electrodes 61, 62, 63, 64, 65, 66 agree with locations of electrodes 1-6, mentioned in the point six of the test method of the ANSI/ESD S7.1-2005 standard.

Figure 6:
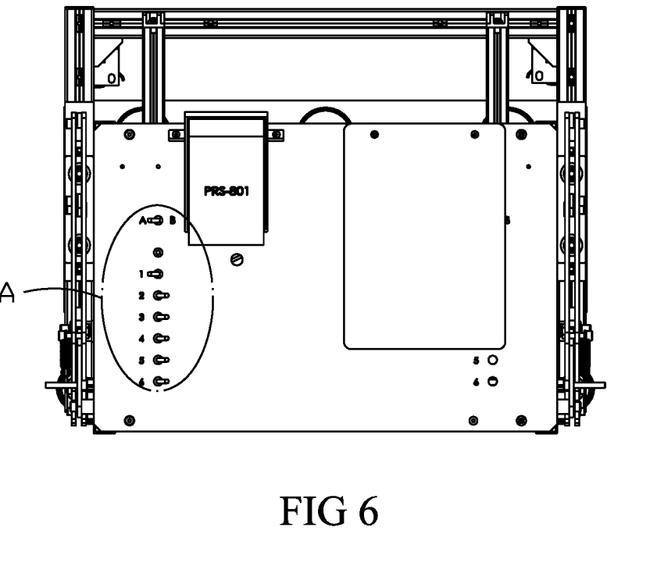
FIG. 6 is top view of the present invention.
Figure 7:
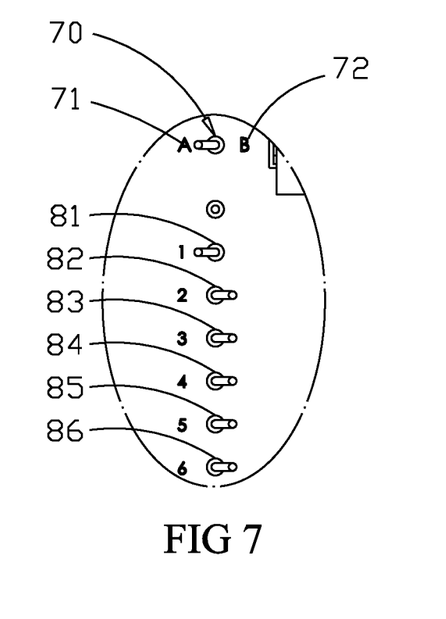
FIG. 7 shows Enlargement of part A in FIG. 6

As shown in FIG. 6-7, the control module 7 is constructed of a first button 70 and six second control buttons 81, 82, 83, 84, 85, in order to coordinate with the two first electrodes and six second electrodes.

The first control button 70 is electrically connected with the first electrode 51 and the first electrode 52 is electrically connected with the resistance measurer 2, wherein there is at least a first option 71 and a second option 72, and furthermore a "off"-option (not shown); wherein the first electrode 51 and the resistance measurer 2 are electrically connected if the first option 71 is optioned; while the first electrode 52 and the resistance measurer 2 are electrically connected if the second option 72 is optioned.

Six second buttons 81, 82, 83, 84, 85, 86 are electrically connected with six second electrodes 61, 62, 63, 64, 65, 66, and all of them also electrically connected with the resistance measurer 2, wherein there are options for "on" and "off". The second electrodes 61, 62, 63, 64, 65, 66 are electrically connected with the resistance measurer 2 if "on" is optioned; while the second electrodes 61, 62, 63, 64, 65, 66 are electrically disconnected with the resistance measurer 2 if "off" is optioned. In this embodiment there are at least following operation ways to measure resistance values of a floor.

Figure 8:
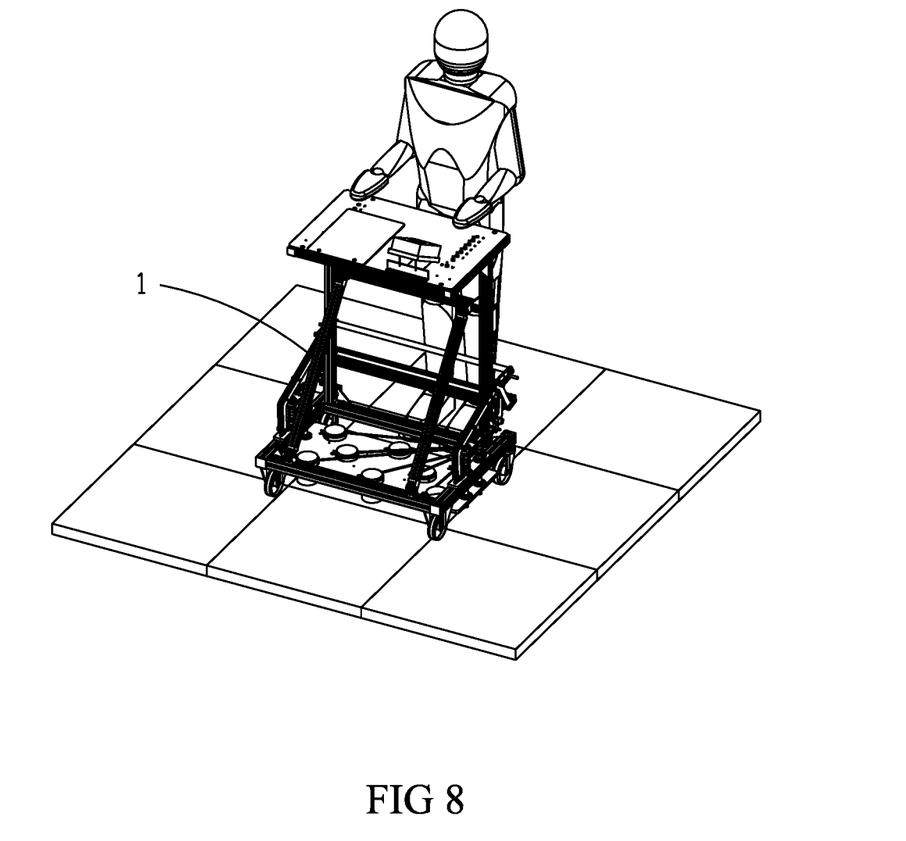
FIG. 8 shows the present invention in using status.

Firstly, a user of standing posture pushes the frame 1 to a certain position (as shown in FIG. 8), then let the substrate fall down, and makes the first electrode and the second electrodes contacting a floor (as shown in FIG. 3). As soon as the frame 1 is located, begin the steps of resistance value measurement. The steps comprise: 1. Setting the first control button 70 as the first option 71 and all the six second control buttons 81, 82, 83, 84, 85, 86 as "off"-option; 2. Setting the second control buttons 81 as "on"-option, and measuring resistance value of a floor contacted by the first electrode 51 the second electrode 61 there between, setting the second control button 81 as "off"-option after data have been recorded; 3. Measuring and recording the resistance values of a floor contacted by the first electrode 51 and the second electrodes 61, 62, 63, 64, 65, 66 there between respectively; 4. Setting the first control button 70 as the second option 72; 5. Measuring and recording resistance values of a floor contacted by the first electrode 52 and the second electrodes 61, 62, 63, 64, 65, 66 there between respectively. After finishing resistance value measurement steps, resistance values of a half floor are resulted, then rotating the frame to 180 grade, shutting another half floor, repeating the resistance value measurement steps once again, thereby resistance values of a full floor are resulted.

In the present invention one can measure resistance values of a floor according to the above mentioned way of operation. In comparison to conventional skill the present invention has following advantages.

1. The present invention can reduce stress of the user. By using the present invention the user can operate in standing posture, corresponding to ergonomic; besides, since locating is helped by the frame, user needs not to press electrodes by himself; therefore burden of a user is reduced. In contrast, by using conventional equipment, user has to operate in sitting or kneeling posture, it is very hard. Thus a team work of labors for turning around in operation is necessary. Furthermore, by using a conventional equipment electrodes are pressed by human labor, it causes not only more burden, but precision is also reduced.

2. The present invention can save time of operation, user needs only to push the frame to a certain position and to operate the lifting system 3, the first control button 70 of the control module 7 and six second control buttons 81, 82, 83, 84, 85, 36, it is very convenient. On the contrary by using conventional equipment, user has to remove electrodes to measure resistance values of each point individually. It takes much time.

3, the present invention is easy to operate. Each component of the present invention, e.g. resistance measurer, the first electrode, the second electrodes all are set in the frame, user needs only to push the frame. On the contrary, by using conventional equipment, user has to move himself, to put electrodes and resistance measurer, then to measure and record. It is very complicated, and it could happen that equipment falls down by accidence.

Figure 9:
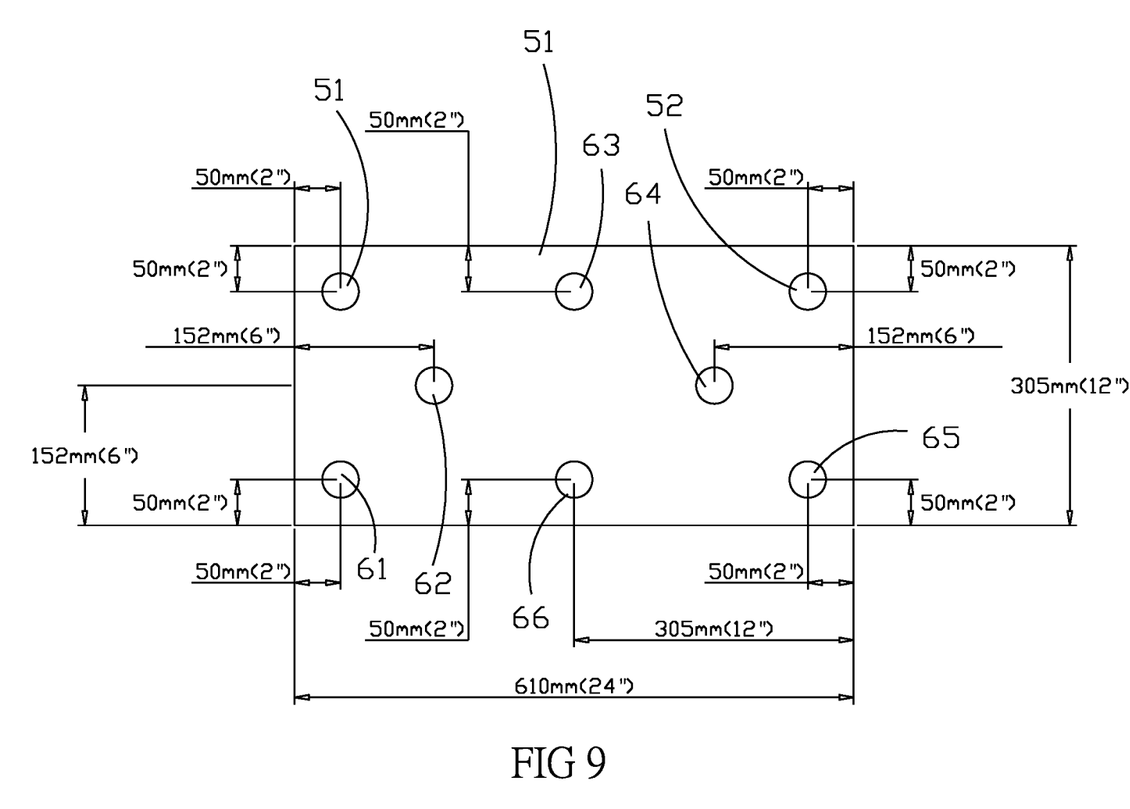
FIG. 9 shows a schema of the substrate of the present invention set according to the test method of the "ESD association" standard.

As shown in FIG. 9, in test method of the "ESD association" standard there is a predestined size of a floor, therefore the said substrate 4 is designed according to the predestined size, the relative positions of each first electrode and second electrodes are also set according to the test method of the "ESD association" standard also.

Figure 10:
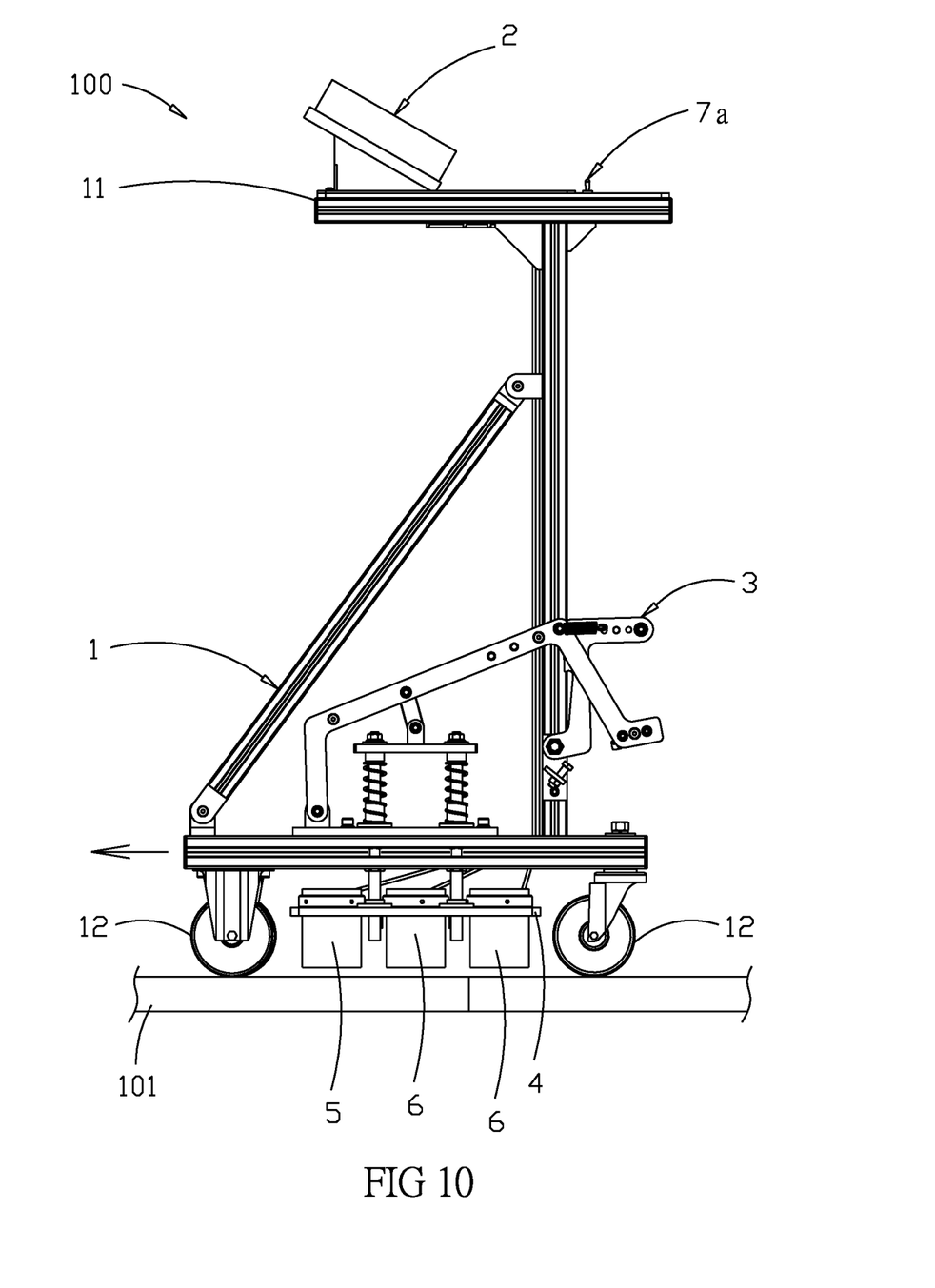
FIG. 10 is a lateral view of the present invention.
Figure 11:
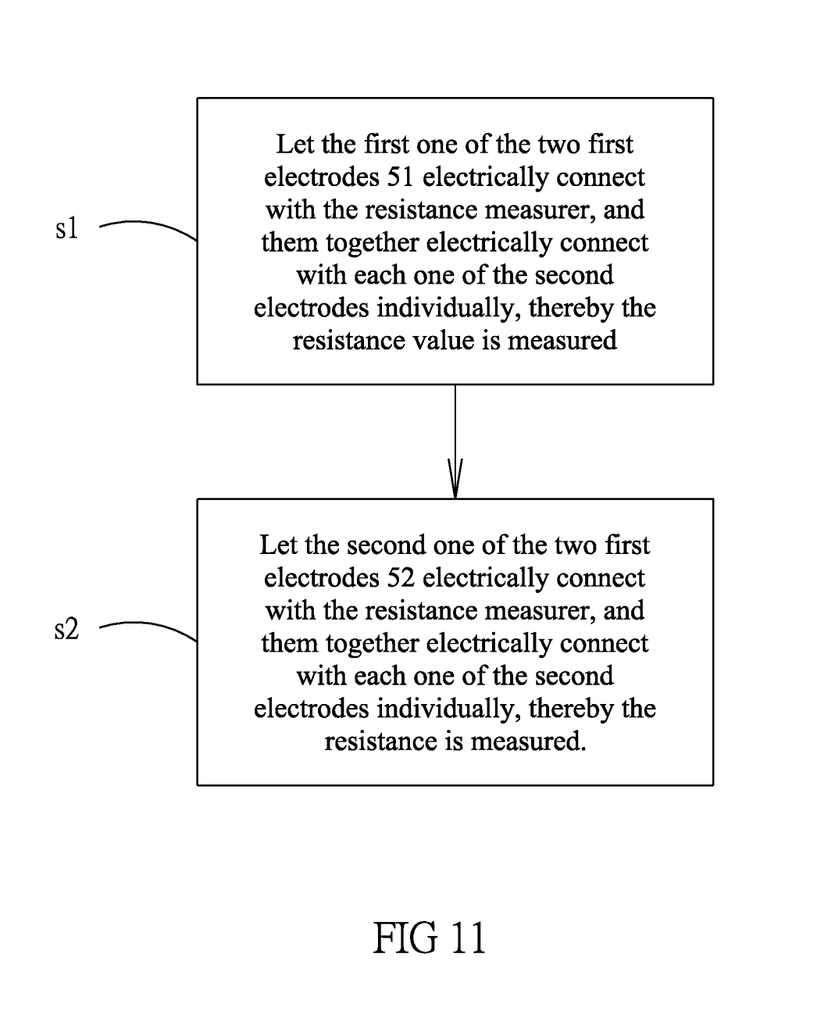
FIG. 11 is a flow chart for resistance value measurement of the present invention.

FIG. 10-11 show an embodiment control module 7a of automatic control in coordination with manual recording. As shown in 10-11, the control module 7a is of automatic control having at least a control switch; wherein the control module 7a begins to work according to steps of resistance value measurement, as soon as "on"-signal has been received, the resistance value measurement steps comprise: (s1): let the first one of the two first electrodes 51 electrically connect with the resistance measurer, and them together electrically connect with each one of the second electrodes individually, thereby the resistance value is measured; (s2): let the second one of the two first electrodes 52 electrically connect with the resistance measurer, and them together electrically connect with each one of the second electrodes individually, thereby the resistance is measured.

Figure 12:
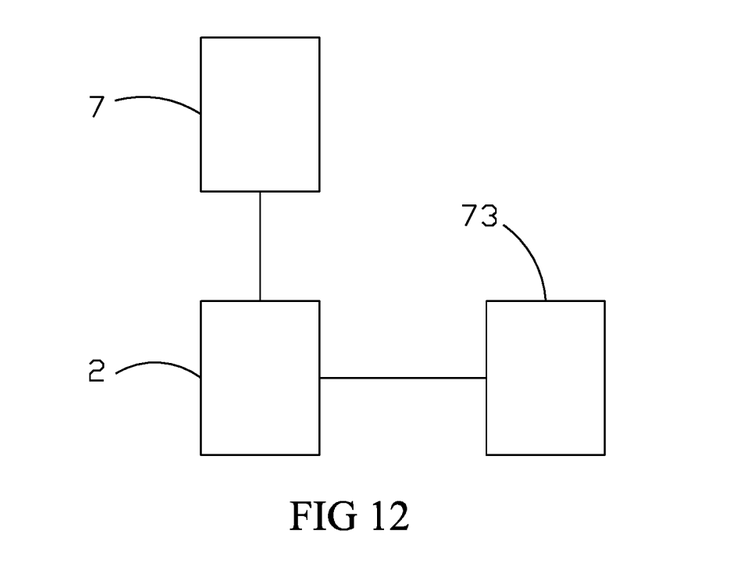
FIG. 12 shows schema of an embodiment of the control module of the present invention of manual control in coordination with computer recording.

FIG. 12 shows an embodiment of the control module 7 of manual control in coordination with computer recording, wherein blocks represent resistance measurer 2, control module 7, computer 73 for demonstration purpose. As shown in FIG. 12, the resistance measurer 12 is connected with a computer 73; which is used to save the resistance values measured by the resistance measurer 2. Connecting between the resistance measurer 2 and the computer 73 is wired or wireless. The computer 73 is set on the said operation panel 11 directly, or on other locations. As soon as the resistance values in the resistance measurer 2 have been received by the control module 7, the computer 73, connected with the resistance measurer 2, can get data of resistance values. Thereby, it is easy to record resistance values and is convenient for further judgement of suitability.

Figure 13:
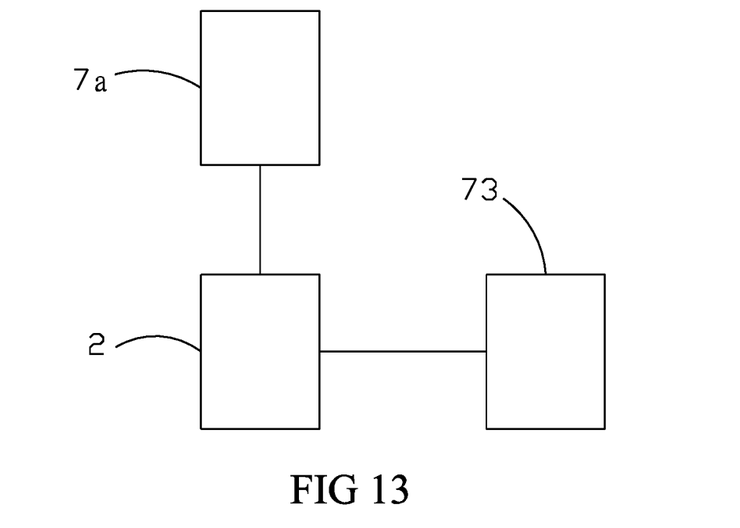
FIG. 13 shows schema of an embodiment of the present invention, wherein control module of automatic control is coordinated with computer recording.

FIG. 13 is an embodiment of control module 7a of automatic control in coordination with computer recording, wherein blocks represent the resistance measurer 2, control module 7a, computer 73 for demonstration purpose. As shown in FIG. 13, the resistance measurer 2 is connected with a computer 73. As soon as the resistance values in the resistance measurer 2 have been received by control module 7a, the computer 73, connected with the resistance measurer 2, can get data of resistance values. Thereby, it is easy to record resistance values and is convenient for further judgement of suitability. Besides, it is considerable, construction and function of the control module 7a to combine with the computer 73 (not show).

The invention claimed is:

1. A mobile trolley for resistance measurement comprises:
    a frame, of predestined height, having an operation panel at the top;
    a resistance measurer, disposed on said operation panel;
    a lifting system, disposed under section of the frame, connecting with a substrate to control lifting of the substrate;
    wherein there are two first electrodes; wherein the set locations of the two first electrodes agree with the ground point A and ground point B, mentioned in the point 6 of the ANSI/ESD S7.1-2005 standard;
    wherein there are six second electrodes; the set locations of the said second electrodes agree with the electrode locations 1-6, mentioned in the point 6 of the test method of the ANSI/ESD S7.1-2005 standard; and
    a control module, set on the operation panel, is electrically connected with the first electrodes, the second electrodes and the resistance measurer respectively; whereby the first electrode and one of the second electrodes is electrically connected with the resistance measurer; thereby the resistance value is measured.

2. The mobile trolley for resistance measurement of the claim 1, wherein the control module is of manual control having at least a first control button and plural second control buttons; wherein said first control button is connected with the first electrode; the second control buttons are connected with the second electrodes respectively.

3. The mobile trolley for resistance measurement of the claim 1, wherein the control module is of automatic control having at least a control switch, wherein the control module makes the first electrode electrically connected with the resistance measurer, as soon as "on"-signal has been received, and is electrically connected with each one of the second electrodes individually; thereby the resistance value is measured.

4. The mobile trolley for resistance measurement of the claim 1, wherein the control module is of manual control, constructed of a first button and six second control buttons.

5. The mobile trolley for resistance measurement of the claim 4, wherein the first button is electrically connected with the two first electrodes, wherein there are at least a first option and a second option; where the first one of the two first electrodes is electrically connected with the resistance measurer if the first option is selected; while the second one of the two first electrodes is electrically connected with the resistance measurer if the second option is selected.

6. The mobile trolley for resistance measurement of the claim 4, wherein the six second control buttons are electrically connected with the six second electrodes respectively and all of them are electrically connected with the resistance measurer in which there are options of "on" and "off" for switching; wherein the second electrodes are electrically connected if "on" is selected, while the second electrodes are electrically disconnected if "off" is selected.

7. The mobile trolley for resistance measurement of the claim 1, wherein the control module is of automatic control having at least a control switch; wherein the control module begins to work according to steps of resistance measurement, as soon as "on"-signal has been received, wherein the steps of resistance measurement comprise: (s1): let the first one of the two first electrodes electrically connect with the resistance measurer, and together connect with each one of the second electrodes individually, whereby the resistance value is measured; (s2): let the second one of the two first electrodes electrically connect with the resistance measurer, and together connect with each one of the second electrodes individually, whereby the resistance is measured.

8. The mobile trolley for resistance measurement of the claim 1, wherein the resistance measurer is connected with a computer; wherein the computer saves the resistance value measured by the resistance measurer.

9. The mobile trolley for resistance measurement of the claim 1, wherein there are plural wheels under the frame.

* * * * *